(12) United States Patent
Forbes Jones et al.

(10) Patent No.: US 8,642,916 B2
(45) Date of Patent: *Feb. 4, 2014

(54) MELTING FURNACE INCLUDING WIRE-DISCHARGE ION PLASMA ELECTRON EMITTER

(75) Inventors: Robin M. Forbes Jones, Charlotte, NC (US); Richard L. Kennedy, Monroe, NC (US)

(73) Assignee: ATI Properties, Inc., Albany, OR (US)

( * ) Notice: Subject to any disclaimer, the term of this patent is extended or adjusted under 35 U.S.C. 154(b) by 1470 days.

This patent is subject to a terminal disclaimer.

(21) Appl. No.: 12/055,415

(22) Filed: Mar. 26, 2008

(65) Prior Publication Data

US 2008/0237200 A1    Oct. 2, 2008

Related U.S. Application Data

(60) Provisional application No. 60/909,118, filed on Mar. 30, 2007.

(51) Int. Cl.
*B23K 31/00* (2006.01)
*C22B 9/04* (2006.01)
*C22B 9/22* (2006.01)

(52) U.S. Cl.
USPC .................................................. 219/121.17

(58) Field of Classification Search
USPC ................. 373/10, 11, 12, 13, 14, 15, 16, 17; 219/121.16, 121.17; 164/506, 512; 118/620, 723 EB
See application file for complete search history.

(56) References Cited

U.S. PATENT DOCUMENTS

| | | | |
|---|---|---|---|
| 3,005,246 A | 10/1961 | Murphy et al. | |
| 3,072,982 A | 1/1963 | Gordon et al. | |
| 3,101,515 A | 8/1963 | Hanks | |
| 3,105,275 A | 10/1963 | Hanks | |
| 3,157,922 A * | 11/1964 | Gruber | 164/494 |
| 3,177,535 A | 4/1965 | Hanks | |
| 3,288,593 A * | 11/1966 | Smith, Jr. et al. | 75/10.48 |

(Continued)

FOREIGN PATENT DOCUMENTS

| CA | 2048836 | 3/1983 |
|---|---|---|
| CA | 2048836 A1 | 4/1992 |

(Continued)

OTHER PUBLICATIONS

D.E. Tyler and W.G. Watson, "Nucleated Casting", *Proceedings of the Third International Conference on Spray Forming*, Sep. 1996, pp. 233-242.

(Continued)

*Primary Examiner* — Geoffrey S Evans
(74) *Attorney, Agent, or Firm* — K&L Gates LLP; John E. Grosselin, III (57) ABSTRACT

An apparatus for melting an electrically conductive metallic material includes a vacuum chamber and a hearth disposed in the vacuum chamber. At least one wire-discharge ion plasma electron emitter is disposed in or adjacent the vacuum chamber and is positioned to direct a wide-area field of electrons into the vacuum chamber, wherein the wide-area electron field has sufficient energy to heat the electrically conductive metallic material to its melting temperature. The apparatus may further include at least one of a mold and an atomizing apparatus which is in communication with the vacuum chamber and is positioned to receive molten material from the hearth.

18 Claims, 6 Drawing Sheets

(56) References Cited

U.S. PATENT DOCUMENTS

| | | | | |
|---|---|---|---|---|
| 3,342,250 A | * | 9/1967 | Treppschuh et al. | 164/469 |
| 3,343,828 A | * | 9/1967 | Hunt | 219/121.16 |
| 3,389,208 A | | 6/1968 | Roberts et al. | |
| 3,420,977 A | | 1/1969 | Hanks et al. | |
| 3,519,059 A | | 7/1970 | Voskoboinikov et al. | |
| 3,547,622 A | | 12/1970 | Hutchinson | |
| 3,576,207 A | | 4/1971 | Grenfell et al. | |
| 3,627,293 A | | 12/1971 | Sperner | |
| 3,690,635 A | | 9/1972 | Harker et al. | |
| 3,702,630 A | | 11/1972 | Peytavin et al. | |
| 3,737,305 A | | 6/1973 | Blayden et al. | |
| 3,786,853 A | * | 1/1974 | Cooper | 164/497 |
| 3,817,503 A | | 6/1974 | Lafferty et al. | |
| 3,825,415 A | | 7/1974 | Johnston et al. | |
| 3,826,301 A | | 7/1974 | Brooks | |
| 3,868,987 A | | 3/1975 | Galey et al. | |
| 3,896,258 A | | 7/1975 | Hanks | |
| 3,909,921 A | | 10/1975 | Brooks | |
| 3,970,892 A | | 7/1976 | Wakalopulos | |
| 3,972,713 A | | 8/1976 | Muzyka et al. | |
| 3,985,177 A | | 10/1976 | Buehler | |
| 3,988,084 A | | 10/1976 | Esposito et al. | |
| 3,989,091 A | | 11/1976 | Medovar et al. | |
| 4,025,818 A | | 5/1977 | Giguere et al. | |
| 4,058,697 A | | 11/1977 | Sokolov et al. | |
| 4,061,944 A | * | 12/1977 | Gay | 313/420 |
| 4,062,700 A | | 12/1977 | Hayami et al. | |
| 4,066,117 A | | 1/1978 | Clark et al. | |
| 4,136,527 A | | 1/1979 | Kading | |
| 4,190,404 A | | 2/1980 | Drs et al. | |
| 4,221,587 A | | 9/1980 | Ray | |
| 4,261,412 A | | 4/1981 | Soykan et al. | |
| 4,264,641 A | | 4/1981 | Mahoney et al. | |
| 4,272,463 A | | 6/1981 | Clark et al. | |
| 4,305,451 A | | 12/1981 | Ksendzyk et al. | |
| 4,343,433 A | | 8/1982 | Sickles | |
| 4,426,141 A | | 1/1984 | Holcomb | |
| 4,441,542 A | | 4/1984 | Pryor et al. | |
| 4,449,568 A | | 5/1984 | Narasimham | |
| 4,471,831 A | | 9/1984 | Ray | |
| 4,482,376 A | | 11/1984 | Tarasescu et al. | |
| 4,544,404 A | | 10/1985 | Yolton et al. | |
| 4,575,325 A | | 3/1986 | Duerig et al. | |
| 4,596,945 A | | 6/1986 | Schumacher et al. | |
| 4,619,597 A | | 10/1986 | Miller | |
| 4,619,845 A | | 10/1986 | Ayers et al. | |
| 4,631,013 A | | 12/1986 | Miller | |
| 4,642,522 A | * | 2/1987 | Harvey et al. | 315/111.31 |
| 4,645,978 A | * | 2/1987 | Harvey et al. | 315/111.81 |
| 4,689,074 A | | 8/1987 | Seaman et al. | |
| 4,694,222 A | | 9/1987 | Wakalopulos | |
| 4,697,631 A | | 10/1987 | Bungeroth et al. | |
| 4,730,661 A | * | 3/1988 | Stephan | 164/506 |
| 4,738,713 A | | 4/1988 | Stickle | |
| 4,755,722 A | * | 7/1988 | Wakalopulos | 315/111.31 |
| 4,762,553 A | | 8/1988 | Savage et al. | |
| 4,762,975 A | | 8/1988 | Mahoney et al. | |
| 4,769,064 A | | 9/1988 | Buss et al. | |
| 4,779,802 A | | 10/1988 | Coombs | |
| 4,786,844 A | * | 11/1988 | Farrell et al. | 315/111.31 |
| 4,788,016 A | | 11/1988 | Colclough et al. | |
| 4,801,411 A | | 1/1989 | Wellinghoff et al. | |
| 4,801,412 A | | 1/1989 | Miller | |
| 4,838,340 A | | 6/1989 | Entrekin et al. | |
| 4,842,170 A | | 6/1989 | Del Vecchio et al. | |
| 4,842,704 A | | 6/1989 | Collins et al. | |
| 4,910,435 A | | 3/1990 | Wakalopulos | |
| 4,916,198 A | * | 4/1990 | Scheve et al. | 526/351 |
| 4,916,361 A | | 4/1990 | Schumacher et al. | |
| 4,919,335 A | | 4/1990 | Hobson et al. | |
| 4,926,923 A | | 5/1990 | Brooks et al. | |
| 4,931,091 A | | 6/1990 | Waite et al. | |
| 4,932,635 A | | 6/1990 | Harker | |
| 4,936,375 A | * | 6/1990 | Harker | 164/506 |
| 4,938,275 A | | 7/1990 | Leatham et al. | |
| 4,955,045 A | | 9/1990 | Friede et al. | |
| 4,961,776 A | | 10/1990 | Harker | |
| 5,004,153 A | | 4/1991 | Sawyer | |
| 5,074,933 A | | 12/1991 | Ashok et al. | |
| 5,084,091 A | | 1/1992 | Yolton | |
| 5,100,463 A | * | 3/1992 | Harker | 219/121.17 |
| 5,102,449 A | | 4/1992 | Ducrocq et al. | |
| 5,102,620 A | | 4/1992 | Watson et al. | |
| 5,104,634 A | | 4/1992 | Calcote | |
| 5,142,549 A | | 8/1992 | Bremer | |
| 5,160,532 A | | 11/1992 | Benz et al. | |
| 5,167,915 A | | 12/1992 | Yamashita et al. | |
| 5,176,874 A | | 1/1993 | Mourer et al. | |
| 5,222,547 A | * | 6/1993 | Harker | 164/506 |
| 5,226,946 A | | 7/1993 | Diehm et al. | |
| 5,240,067 A | | 8/1993 | Hatch | |
| 5,263,044 A | | 11/1993 | Bremer | |
| 5,266,098 A | | 11/1993 | Chun et al. | |
| 5,268,018 A | | 12/1993 | Mourer et al. | |
| 5,272,718 A | | 12/1993 | Stenzel et al. | |
| 5,291,940 A | | 3/1994 | Borofka et al. | |
| 5,296,274 A | | 3/1994 | Movchan et al. | |
| 5,302,881 A | | 4/1994 | O'Loughlin | |
| 5,310,165 A | | 5/1994 | Benz et al. | |
| 5,325,906 A | | 7/1994 | Benz et al. | |
| 5,332,197 A | | 7/1994 | Benz et al. | |
| 5,346,184 A | | 9/1994 | Ghosh | |
| 5,348,566 A | | 9/1994 | Sawyer et al. | |
| 5,366,206 A | | 11/1994 | Sawyer et al. | |
| 5,368,897 A | | 11/1994 | Kurihara et al. | |
| 5,377,961 A | | 1/1995 | Smith et al. | |
| 5,378,957 A | | 1/1995 | Kelly | |
| 5,381,847 A | | 1/1995 | Ashok et al. | |
| 5,384,821 A | | 1/1995 | Jedlitschka et al. | |
| 5,460,851 A | | 10/1995 | Jenkins | |
| 5,472,177 A | | 12/1995 | Benz et al. | |
| 5,480,097 A | | 1/1996 | Carter, Jr. et al. | |
| 5,489,820 A | | 2/1996 | Ivanov et al. | |
| 5,503,655 A | | 4/1996 | Joseph | |
| 5,527,381 A | | 6/1996 | Waite et al. | |
| 5,649,992 A | | 7/1997 | Carter, Jr. et al. | |
| 5,649,993 A | | 7/1997 | Carter, Jr. et al. | |
| 5,683,653 A | | 11/1997 | Benz et al. | |
| 5,699,850 A | | 12/1997 | Beitelman et al. | |
| 5,722,479 A | | 3/1998 | Oeftering | |
| 5,749,938 A | | 5/1998 | Coombs | |
| 5,749,989 A | | 5/1998 | Linman et al. | |
| 5,769,151 A | | 6/1998 | Carter, Jr. et al. | |
| 5,809,057 A | | 9/1998 | Benz et al. | |
| 5,810,066 A | | 9/1998 | Knudsen et al. | |
| 5,841,235 A | | 11/1998 | Engelko et al. | |
| 5,894,980 A | | 4/1999 | Orme-Marmarelis et al. | |
| 5,954,112 A | | 9/1999 | Forbes Jones et al. | |
| 5,972,282 A | | 10/1999 | Aguirre et al. | |
| 5,985,206 A | | 11/1999 | Zabala et al. | |
| 6,043,451 A | | 3/2000 | Julien et al. | |
| 6,068,043 A | | 5/2000 | Clark | |
| 6,103,182 A | | 8/2000 | Campbell | |
| 6,135,194 A | | 10/2000 | Flinn et al. | |
| 6,156,667 A | | 12/2000 | Jewett | |
| 6,162,377 A | | 12/2000 | Ghosh et al. | |
| 6,168,666 B1 | | 1/2001 | Sun | |
| 6,264,717 B1 | | 7/2001 | Carter, Jr. et al. | |
| 6,350,293 B1 | | 2/2002 | Carter, Jr. et al. | |
| 6,407,399 B1 | * | 6/2002 | Livesay | 250/492.3 |
| 6,416,564 B1 | | 7/2002 | Bond | |
| 6,427,752 B1 | | 8/2002 | Carter, Jr. et al. | |
| 6,460,595 B1 | | 10/2002 | Benz et al. | |
| 6,491,737 B2 | | 12/2002 | Orme-Marmarelis et al. | |
| 6,496,529 B1 | | 12/2002 | Forbes Jones et al. | |
| 6,562,099 B2 | | 5/2003 | Orme-Marmarelis et al. | |
| 6,613,266 B2 | | 9/2003 | McDonald | |
| 6,631,753 B1 | | 10/2003 | Carter, Jr. et al. | |
| 6,772,961 B2 | | 8/2004 | Forbes Jones et al. | |
| 6,904,955 B2 | | 6/2005 | Jackson et al. | |
| 6,975,073 B2 | | 12/2005 | Wakalopulos | |
| 7,033,444 B1 | | 4/2006 | Komino et al. | |
| 7,114,548 B2 | | 10/2006 | Forbes Jones et al. | |
| 7,150,412 B2 | | 12/2006 | Wang et al. | |

(56) References Cited

U.S. PATENT DOCUMENTS

| | | | |
|---|---|---|---|
| 7,152,432 B2 | 12/2006 | Wanner et al. | |
| 7,154,932 B2 | 12/2006 | Forbes Jones et al. | |
| 7,337,745 B1 | 3/2008 | Komino et al. | |
| 7,374,598 B2 | 5/2008 | Forbes Jones et al. | |
| 7,425,716 B2 | 9/2008 | Demos et al. | |
| 7,439,188 B2 | 10/2008 | DeOrnellas et al. | |
| 7,578,960 B2 | 8/2009 | Forbes Jones et al. | |
| 7,798,199 B2 | 9/2010 | Forbes Jones et al. | |
| 7,803,211 B2 * | 9/2010 | Forbes Jones | 75/336 |
| 7,803,212 B2 | 9/2010 | Forbes Jones et al. | |
| 8,156,996 B2 | 4/2012 | Forbes Jones et al. | |
| 8,216,339 B2 | 7/2012 | Forbes Jones et al. | |
| 8,302,661 B2 | 11/2012 | Forbes Jones et al. | |
| 2005/0173847 A1 | 8/2005 | Blackburn et al. | |
| 2007/0062332 A1 | 3/2007 | Forbes Jones et al. | |
| 2007/0151695 A1 | 7/2007 | Forbes Jones et al. | |
| 2008/0072707 A1 | 3/2008 | Forbes Jones et al. | |
| 2008/0115905 A1 | 5/2008 | Forbes Jones et al. | |
| 2008/0179033 A1 * | 7/2008 | Forbes Jones | 164/512 |
| 2008/0179034 A1 | 7/2008 | Forbes Jones et al. | |
| 2008/0223174 A1 | 9/2008 | Forbes Jones et al. | |
| 2009/0139682 A1 | 6/2009 | Forbes Jones et al. | |
| 2010/0012629 A1 | 1/2010 | Forbes Jones et al. | |
| 2010/0258262 A1 | 10/2010 | Forbes Jones et al. | |
| 2010/0276112 A1 | 11/2010 | Forbes Jones et al. | |
| 2010/0314068 A1 | 12/2010 | Forbes Jones et al. | |
| 2012/0168110 A1 | 7/2012 | Forbes Jones et al. | |

FOREIGN PATENT DOCUMENTS

| | | |
|---|---|---|
| DE | 3810294 | 12/1985 |
| DE | 3810294 | 10/1988 |
| DE | 4011392 B4 | 4/2004 |
| EP | 0073585 A1 | 3/1983 |
| EP | 0095298 A1 | 11/1983 |
| EP | 0073585 A1 | 1/1986 |
| EP | 0225732 B1 | 6/1987 |
| EP | 0400089 B1 | 10/1988 |
| EP | 0428527 B1 | 10/1988 |
| EP | 0486830 A2 | 2/1990 |
| EP | 1101552 A2 | 2/1991 |
| EP | 0225732 B1 | 1/1992 |
| EP | 0486830 A2 | 5/1992 |
| EP | 0518536 A1 | 12/1992 |
| EP | 0400089 B1 | 6/1993 |
| EP | 0428527 B1 | 8/1996 |
| EP | 1101552 A2 | 5/2001 |
| GB | 2203889 A | 10/1988 |
| GB | 2203889 A | 4/1992 |
| JP | 01-313181 A | 12/1989 |
| JP | 01-313182 A | 12/1989 |
| JP | 3-36205 A | 2/1991 |
| JP | H03-36205 | 5/1992 |
| JP | 6-246425 | 9/1994 |
| JP | 8-506382 A | 7/1996 |
| JP | 2001-6572 A | 1/2001 |
| JP | 2001-212662 A | 8/2001 |
| JP | 2002-311877 A | 10/2002 |
| RU | 2089633 C1 | 6/1993 |
| RU | 2089633 C1 | 9/1997 |
| WO | WO 85/05489 A1 | 12/1985 |
| WO | WO 86/00466 A1 | 1/1986 |
| WO | WO 90/01250 A1 | 2/1990 |
| WO | WO 97/49837 A1 | 12/1997 |
| WO | WO 01/96028 A1 | 12/2001 |
| WO | WO 02/40197 A2 | 5/2002 |

OTHER PUBLICATIONS

E.J. Lavernia and Y. Wu, "Spray Atomization and Deposition" (John Wiley & Sons, Dec. 1996), pp. 311-314.

L.A. Bertram et al., "Quantitative Simulations of a Superalloy VAR Ingot at the Macroscale", *Proceedings of the 1997 International Symposium on Liquid Metal Processing and Casting*, A. Mitchell and P. Auburtin, eds., (Am. Vac. Soc., 1997)., pp. 110-132.

JOM, "Solidification Processing of Materials in Magnetic Fields", copyright held by *The Minerals, Metals & Materials Society*, 1998.

William T. Carter, Jr. and Robin M. Forbes-Jones, "Nucleated Casting for Land-Based Gas Turbines", *Advanced Materials & Processes*, Jul. 2002, pp. 27-29.

Alan Leatham, "Spray Forming: Alloys, Products, and Markets", *JOM-e*, Apr. 1999 (vol. 51, No. 4) 13 pages.

W.T. Carter, Jr. et al. "The CMSF Process: The Spray Forming of Clean Metal", *JOM-e*, Apr. 1999 (vol. 51, No. 4) 7 pages.

William T. Carter, Jr. and Robin M. Forbes-Jones, "Nucleated Casting for the Production pf Large Superalloy Ingots", *JOM*, Apr. 2005, pp. 52-57.

Sears, Francis Weston, An Introduction to Thermodynamics, the Kinetic Theory of Gases, and Statistical Mechanics, 2nd Edition, Addison-Wesley, 1959 pp. 335-337.

Macky, W.A., "Some Investigations on the Deformation of Water Droplets in Strong Electric Fields", Proc. Roy. Soc. London, Series A, 133, pp. 565-587, 1931.

V. A. Chernov, "Powerful High-Voltage Glow Discharge Electron Gun and Power Unit on Its Base," 1994 Intern. Conf, of Electron Beam Melting (Reno, Nevada), pp. 259-267.

E. M. Oks, et al., "Development of Plasma Cathode Electron Guns," Physics of Plasmas, vol. 6, No. 5, pp. 1649-1654, May 1999.

W. Clark, "Electron Gun Technology," Hughes Research Laboratories, Final Report No. N00014-72-C-0496, 92 pages, Dec. 1976.

"Electron-Beam Melting of Titanium," printed from http://www.antares.com.ua, Internet site, website accessed on Apr. 4, 2007, 6 pages.

G. Wakalopulos, "Pulsed WIP Electron Gun. Final Report—Fabrication Phase 1×40 cm and 1×70 cm Cooled WIP Electron Gun," Mar. 1979-Dec. 1980.

W. M. Clark, et al., "Ion Plasma Electron Gun Research," Dec. 1977.

G. Sanchez, et al., "Thermal Effect of Ion Implantation with Ultra-Short Ion Beams," Surface and Coatings Technology, vol. 70, pp. 181-186 (1995).

M. L. Sentis, et al., "Parametric Studies of X-Ray Preionized Discharge XeCl Laser at Single Short and at High Pulse Rate Frequency (1 kHz)," J. Appl. Phys., vol. 66, No. 5, pp. 1925-1930, Sep. 1, 1989.

L. Arif, et al., "Waves Behaviour in a High Repetition High Average Power Excimer Laser," SPIE vol. 1031 GCL—Seventh International Symposium on Gas Flow and Chemical Lasers, pp. 392-399 (1988).

N. N. Semashko, "Sources of Gas-Ion Beams with Current up to 60 A for Controlled Thermonuclear Fusion and Technological Applications," Atomic Energy, vol. 82, No. 1, pp. 21-27, 1997.

B. A. Knyazev, et al., "Pulsed Plasma Sources for the Production of Intense Ion Beams Based on "Catalytic" Resonance Ionization," 18 pages, 1994.

B. L. Fontaine, et al., "Performance Characteristics of a Long Pulse and High Average Power XeCl Discharge Laser," SPIE vol. 801, High Power Lasers, pp. 100-105 (1987).

Sandia National Labs, "Particle Beam Fusion Progress Report, Jan.-Jun. 1980," published May 1981.

P. F. McKay, "Development of a Twelve-Plasma Gun, Single-Pulser Combination for Use in the PBFA-1 Hybrid Ion Diode," published Oct. 1985.

A. J. Cohen, "Anomalous Diffusion in a Plasma Formed from the Exhaust Beam of an Electron-Bombardment Ion Thruster," published Aug. 1968.

L. E. Weddle, "Ion Gun Generated Electromagnetic Interference on the Scatha Satellite," Dec. 1987.

S. Suckewer, "Spectral Measurements of Plasma Temperature in the Rod Plasma Injector (RPI)," Nukleonika, No. 1, 1970.

R. C. Olsen, et al., "Plasma Wave Observations During Ion Gun Experiments," Journal of Geophysical Research, vol. 95, No. A6, pp. 7759-7771, Jun. 1, 1990.

Y. Kiwamoto, "Small Barium Rail Gun for Plasma Injection," Rev. Sci. Instrum., vol. 51. No. 3, pp. 285-287, Mar. 1980.

S. Humphries, Jr., et al., "Pulsed Plasma guns for Intense Ion Beam Injectors," Rev. Sci. Instrum. vol. 52, No. 2, pp. 162-171, Feb. 1981.

H. Tamura, et al., "A Plasma Ion Gun with Pierce Electrode," Japan J. Appl. Phys. 5, pp. 985-987 (1966).

(56) References Cited

OTHER PUBLICATIONS

V. M. Chicherov, "Density Distribution of Hydrogen in the Interior of a Coaxial Plasma Injector Prior to the Application of High Voltage to its Electrodes," Journal of Technical Physics, vol. 36, No. 6, pp. 1055-1057, 1966.
L. M. Smith, et al., "Interferometric Investigation of a Cablegun Plasma Injector," IEEE Transactions on Plasma Science, vol. 28, No. 6, pp. 2272-2275, Dec. 2000.
A. Vizir, et al., "Recent Development and Applications of Electron, Ion and Plasma Sources Based on Vacuum Arc and Low Pressure Glow," IEEE Int. Conf. Plasma Sci., p. 286 (2004).
Kuiken, Gerard, "Thermodynamics of Irreversible Processes: Applications to Diffusion and Rheology", John Wiley & Sons, Oct. 1994.
Cobine, James Dillon, "Gaseous Conductors: Theory and Engineering Applications", Dover Publications, Inc. New York (1958).
Office Action dated Jul. 12, 2010 in U.S. Appl. No. 11/841,941.
Notice of Allowance dated Jul. 2, 2010 in U.S. Appl. No. 12/053,238.
Office Action dated Nov. 9, 2010 in U.S. Appl. No. 11/564,021.
Office Action dated Jan. 21, 2011 in U.S. Appl. No. 11/564,021.
Office Action dated Jun. 25, 2010 in U.S. Appl. No. 12/502,558.
Office Action dated Sep. 23, 2010 in U.S. Appl. No. 12/502,558.
Notice of Allowance dated Jan. 3, 2011 in U.S. Appl. No. 12/861,033.
Office Action dated Dec. 21, 2007 in U.S. Appl. No. 11/232,702.
Office Action dated Jul. 18, 2008 in U.S. Appl. No. 11/232,702.
Office Action dated Dec. 12, 2008 in U.S. Appl. No. 11/232,702.
Notice of Allowance dated Apr. 13, 2009 in U.S. Appl. No. 11/232,702.
Office Action dated Mar. 11, 2009 in U.S. Appl. No. 11/933,361.
Office Action dated Nov. 10, 2009 in U.S. Appl. No. 11/933,361.
Office Action dated Feb. 13, 2009 in U.S. Appl. No. 11/841,941.
Office Action dated Oct. 1, 2009 in U.S. Appl. No. 11/841,941.
Office Action dated Jun. 28, 2007 in U.S. Appl. No. 10/913,361.
Office Action dated Sep. 26, 2007 in U.S. Appl. No. 10/913,361.
Notice of Allowance dated Jan. 14, 2008 in U.S. Appl. No. 10/913,361.
Office Action dated Dec. 19, 2002 in U.S. Appl. No. 10/158,382.
Office Action dated Jun. 3, 2003 in U.S. Appl. No. 10/158,382.
Office Action dated Mar. 18, 2004 in U.S. Appl. No. 10/158,382.
Office Action dated Dec. 29, 2004 in U.S. Appl. No. 10/158,382.
Office Action dated Aug. 25, 2005 in U.S. Appl. No. 10/158,382.
Notice of Allowance dated May 2, 2006 in U.S. Appl. No. 10/158,382.
Supplemental Notice of Allowability dated Jun. 12, 2006 in U.S. Appl. No. 10/158,382.
Supplemental Notice of Allowability dated Jun. 29, 2006 in U.S. Appl. No. 10/158,382.
Office Action dated Nov, 20, 2002 in U.S. Appl. No. 09/882,248.
Office Action dated Jan. 21, 2003 in U.S. Appl. No. 09/882,248.
Office Action dated Jul. 8, 2003 in U.S. Appl. No. 09/882,248.
Notice of Allowance dated Oct. 22, 2003 in U.S. Appl. No. 09/882,248.
Office Action dated Dec. 6, 2001 in U.S. Appl. No. 09/726,720.
Notice of Allowance dated Apr. 23, 2002 in U.S. Appl. No. 09/726,720.
Office Action dated Aug. 29, 2005 in U.S. Appl. No. 11/008,048.
Office Action dated Nov. 8, 2005 in U.S. Appl. No. 11/008,048.
Response to Rule 312 Communication dated Aug. 16, 2006 in U.S. Appl. No. 11/008,048.
Notice of Allowance dated Jun. 27, 2006 in U.S. Appl. No. 11/008,048.
Office Action dated Apr. 27, 2010 in U.S. Appl. No. 11/564,021.
Office Action dated Nov. 27, 2009 in U.S. Appl. No. 12/053,238.
Office Action dated Jun. 3, 2010 in U.S. Appl. No. 12/053,238.
Office Action dated Dec. 9, 2009 in U.S. Appl. No. 12/053,245.
Notice of Allowance dated Jun. 9, 2010 in U.S. Appl. No. 12/053,245.
Notice of Allowance dated Jun. 2, 2010 in U.S. Appl. No. 11/949,808.
ALD Vacuum Technologies: Electron Beam Melting (EB), printed from http://web.ald-vt.de/cms/vakuum-technologie/anlagen/electron-beam-melting-eb, website accessed on Aug. 25, 2009, 4 pages.
Bakish, R., "The Substance of Technology: Electron Beam Melting and Refining", JOM, Nov. 1998, pp. 28-30.
Hasse, Rolf, "Thermodynamics of Irreversible Processes", Dover Publications, Inc., New York, 1990, 5 pages.
Tien et al., "Superalloys, Supercomposites and Superceramics", Academic Press, Inc., Dec. 1989, pp. 49, 76-84.
Ausmus, S.L. and R.A. Beall, "Electroslag Melting of Titanium Slabs", Trans. Internat., Vacuum Metallurgy Conf., Dec. 1967, pp. 675-694.
Chronister et al., "Induction Skull Melting of Titanium and Other Reactive Alloys", Journal of Metals, Sep. 1986, pp. 51-54.
Office Action dated May 2, 2011 in U.S. Appl. No. 12/502,558.
Notice of Allowance dated Jun. 22, 2011 in U.S. Appl. No. 12/502,558.
Notice of Allowance dated Feb. 13, 2012 in U.S. Appl. No. 12/502,558.
Corrected Notice of Allowability dated Jun. 12, 2012 in U.S. Appl. No. 12/502,558.
Notice of Allowance dated Feb. 17, 2011 in U.S. Appl. No. 12/861,033.
Office Action dated Jul. 14, 2011 in U.S. Appl. No. 11/978,923.
Office Action dated Oct. 20, 2011 in U.S. Appl. No. 11/978,923.
Office Action dated May 4, 2012 in U.S. Appl. No. 11/978,923.
Office Action dated Aug. 3, 2011 in U.S. Appl. No. 13/108,402.
Notice of Allowance dated Dec. 21, 2011 in U.S. Appl. No. 13/108,402.
U.S. Appl. No. 13/207,629, filed Aug. 11, 2011.
Office Action dated Dec. 14, 2011 in U.S. Appl. No. 12/831,669.
Notice of Allowance dated Mar. 9, 2012 in U.S. Appl. No. 12/831,669.
Notice of Allowability dated Jun. 22, 2012 in U.S. Appl. No. 12/831,669.
Office Action dated Jun. 18, 2012 in U.S. Appl. No. 13/420,910.
Notice of Allowance dated Sep. 10, 2012 in U.S. Appl. No. 13/420,910.
Notice of Allowance dated Apr. 12, 2012 in U.S. Appl. No. 12/821,480.
Notice of Allowability dated Jun. 26, 2012 U.S. Appl. No. 12/821,480.
ALD Vacuum Technologies AG, "Electron Beam Melting (EB), Electron Beam Melting Processes and Furnaces," Sep. 17, 2008, 6 pages.
Office Action dated Oct. 10, 2012 in U.S. Appl. No. 12/546,785.
Office Action dated Jan. 24, 2013 in U.S. Appl. No. 12/546,785.
Cao, Wei-Di, "Solidification and Solid State Phase Transformation of Allvac® 718Plus™ Alloy", Journal of the Minerals, Metals & Materials Society, Aug. 1, 2006, pp. 165-177.
Bhatia, A., "Thermal Spraying Technology and Applications", Continuing Education and Development, Inc. Jan. 29, 1999, 91 pages.
H. Duval, et al., "Theoretical and Experimental Approach of the Volatilization in Vacuum Metallurgy," pp. 83-97; Proceedings of the Conference on Electron Beam Melting and Refining-State of the Art 1997, R. Bakish ed., Bakish Materials Corporation (1997). Applicants point out that the year of publication is sufficiently earlier than the effective U.S. filing date and any foreign priority date so that the particular month of publication is not in issue. *See* MPEP 609.04(a)(I).
U.S. Appl. No. 13/919,233, filed Jun. 17, 2013.
Office Action dated May 29, 2013 in U.S. Appl. No. 11/564,021.
Office Action dated May 24, 2013 in U.S. Appl. No. 13/207,629 filed.

* cited by examiner

MELTING FURNACE INCLUDING WIRE-DISCHARGE ION PLASMA ELECTRON EMITTER

CROSS-REFERENCE TO RELATED APPLICATIONS

The present application claims priority under 35 U.S.C. §119(e) to U.S. Provisional Patent Application Ser. No. 60/909,118, filed Mar. 30, 2007.

BACKGROUND OF THE TECHNOLOGY

1. Field of Technology

The present disclosure relates to equipment and techniques for melting metals and metallic alloys (hereinafter "alloys"). The present disclosure more specifically relates to equipment and techniques utilizing electrons to melt metals and alloys and/or the materials while in a molten state.

2. Description of the Background of the Technology

The alloy melting process involves preparing a charge of suitable materials and then melting the charge. The molten charge or "melt" may then be refined and/or treated to modify melt chemistry, remove undesirable components from the melt, and/or affect the microstructure of articles cast from the melt. Melting furnaces are powered by either electricity or the combustion of fossil fuels, and selection of a suitable apparatus is largely influenced by the relative costs and applicable environmental regulations, as well as by the identity of the material being prepared. A variety of melting techniques and apparatus are available today. General classes of melting techniques include, for example, induction melting (including vacuum induction melting), arc melting (including vacuum arc skull melting), crucible melting, and electron beam melting.

Electron beam melting typically involves utilizing thermo-ionic electron beam guns to generate high energy substantially linear streams of electrons which are used to heat the target materials. Thermo-ionic electron beam guns operate by passing current to a filament, thereby heating the filament to high temperature and "boiling" electrons away from the filament. The electrons generated from the filament are then focused and accelerated toward the target in the form of a very narrow, substantially linear electron beam. A type of ion plasma electron beam gun also has been used for preparing alloy melts. Specifically, a "glow discharge" electron beam gun described in V. A. Chernov, "Powerful High-Voltage Glow Discharge Electron Gun and Power Unit on Its Base", 1994 Intern. Conf. on Electron Beam Melting (Reno, Nev.), pp. 259-267, has been incorporated in certain melting furnaces available from Antares, Kiev, Ukraine. Such devices operate by producing a cold plasma including cations which bombard a cathode and produce electrons that are focused to form a substantially linear electron beam.

The substantially linear electron beams produced by the foregoing types of electron beam guns are directed into the evacuated melting chamber of an electron beam melting furnace and impinged on the materials to be melted and/or maintained in a molten state. The conduction of electrons through the electrically conductive materials quickly heats them to a temperature in excess of the particular melting temperature. Given the high energy of the substantially linear electron beams, which can be, for example, about 100 kW/cm$^2$, linear electron beam guns are very high temperature heat sources and are readily able to exceed the melting and, in some cases, the vaporization temperatures of the materials on which the substantially linear beams impinge. Using magnetic deflection or similar directional means, the substantially linear electron beams are rastered at high frequency across the target materials within the melting chamber, allowing the beam to be directed across a wide area and across targets having multiple and complex shapes.

Because electron beam melting is a surface heating method, it typically produces only a shallow molten pool, which can be advantageous in terms of limiting porosity and segregation in the cast ingot. Because the superheated metal pool produced by the electron beam is disposed within the high vacuum environment of the furnace melting chamber, the technique also beneficially tends to degas the molten material. Also, undesirable metallic and non-metallic constituents within the alloy having relatively high vapor pressures can be selectively evaporated in the melting chamber, thereby improving alloy purity. On the other hand, one must account for the evaporation of desirable constituents produced by the highly-focused substantially linear electron beam. Undesirable evaporation must be factored into production and can significantly complicate alloy production when using electron beam melting furnaces.

Various melting and refining methods involve the electron beam melting of feed stocks using thermo-ionic electron guns. Drip melting is a classic method used in thermo-ionic electron beam gun melting furnace for processing refractory metals such as, for example, tantalum and niobium. Raw material in the form of a bar is typically fed into the furnace chamber and a linear electron beam focused on the bar drip-melts the material directly into a static or withdrawal mold. When casting in a withdrawal mold, the liquid pool level is maintained on the top of the growing ingot by withdrawing the ingot bottom. The feed material is refined as a result of the degassing and selective evaporation phenomena described above.

The electron beam cold hearth melting technique is commonly used in the processing and recycling of reactive metals and alloys. The feedstock is drip melted by impinging a substantially linear electron beam on an end of a feedstock bar. The melted feedstock drips into an end region of a water-cooled copper hearth, forming a protective skull. As the molten material collects in the hearth, it overflows and falls by gravity into a withdrawal mold or other casting device. During the molten material's dwell time within the hearth, substantially linear electron beams are quickly rastered across the surface of the material, retaining it in a molten form. This also has the effects of degassing and refining the molten material through evaporation of high vapor pressure components. The hearth also may be sized to promote gravity separation between high-density and low-density solid inclusions, in which case oxide and other relatively low-density inclusions remain in the molten metal for a time sufficient to allow dissolution while high density particles sink to the bottom and become trapped in the skull.

Given the various benefits of conventional electron beam melting techniques, it would be advantageous to further improve this technology.

SUMMARY

According to one non-limiting aspect of the present disclosure, an embodiment of an apparatus for melting an electrically conductive metallic material is described. The apparatus includes a vacuum chamber, a hearth disposed in the vacuum chamber, and at least one wire-discharge ion plasma electron emitter within or adjacent to the vacuum chamber. The wire-discharge ion plasma electron emitter is positioned to direct a wide-area electron field into the chamber, wherein the electron field has energy sufficient to heat the electrically conductive metallic material to its melting temperature. A mold or other casting or atomizing device is in communication with the chamber and is positioned to receive molten material from the hearth. Certain non-limiting embodiments of the melting apparatus may be operated at chamber pressures greater than chamber pressures of conventional electron beam melting furnaces so as to reduce or eliminate the vaporization in the chamber of volatile elements from the molten material.

According to another non-limiting aspect of the present disclosure, an electron beam cold hearth melting furnace is described including a vacuum chamber and a hearth disposed in the vacuum chamber, the hearth including a molten material holding region. The furnace further includes at least one wire-discharge ion plasma electron emitter that is disposed in or is adjacent to the vacuum chamber. The hearth and the at least one wire-discharge ion plasma electron emitter are disposed so that a wide-area electron field emitted by the wire-discharge ion plasma electron emitter at least partially impinges on the molten material holding region and any material disposed within the region. A withdrawal mold is in communication with the chamber and is positioned to receive molten material from the hearth. At least one material feeder is in communication with the chamber and is adapted to introduce electrically conductive feed material into the vacuum chamber in a position over a region of the hearth. Certain non-limiting embodiments of the electron beam cold hearth melting furnace may be operated at vacuum chamber pressures greater than chamber pressures of conventional electron beam melting furnaces so as to reduce or eliminate the vaporization in the vacuum chamber of volatile elements from the molten material.

According to yet another non-limiting aspect of the present disclosure, a method of processing a material is provided. The method includes introducing a material including at least one of an electrically conductive metal and metallic alloy into a melting chamber that is maintained at a low pressure relative to atmospheric pressure. The material is subjected to a wide-area electron field within the chamber so as to heat the material to a temperature above its melting temperature. The wide-area electron field is at least partially generated by at least one wire-discharge ion plasma electron emitter. Optionally, a casting or a powder is formed from the material subsequent to or simultaneous with subjecting the material to the electron field. In certain non-limiting embodiments of the method the pressure within the melting chamber is greater than the melting chamber pressures of conventional electron beam melting furnaces so as to reduce or eliminate the vaporization in the melting chamber of volatile elements from the molten material within the melting chamber.

According to a further aspect of the present disclosure a method of processing a material is provided including introducing at least one electrically conductive material selected from titanium, titanium alloys, tungsten, niobium, tantalum, platinum, palladium, zirconium, iridium, nickel, nickel base alloys iron, iron base alloys, cobalt, and cobalt base alloys into a chamber maintained at a low pressure relative to atmospheric pressure. The material is subjected to a wide-area electron field within the chamber to heat the material to a temperature above a melting temperature of the material, wherein the wide-area electron field is generated by a wire-discharge ion plasma electron emitter. Optionally, at least one alloying additive is added to the material within the chamber. A casting or a powder is formed from the material either subsequent to or simultaneous with subjecting the material to the electron field. In certain non-limiting embodiments of the processing method the pressure within the chamber is greater than the melting chamber pressures of conventional electron beam melting furnaces so as to reduce or eliminate the vaporization in the chamber of volatile elements from the molten material within the melting chamber.

According to yet a further aspect of the present disclosure a method is provided for decreasing or eliminating undesirable evaporation of volatile elements from a molten material during heating of the material in a vacuum chamber of an electron beam melting furnace. The method includes maintaining the pressure within the vacuum chamber at at least 40μ (5.3 Pa) during at least a portion of the time for which the material is being heated in the vacuum chamber.

BRIEF DESCRIPTION OF THE DRAWINGS

Features and advantages of the apparatus and methods described herein may be better understood by reference to the accompanying drawings in which.

The reader will appreciate the foregoing details, as well as others, upon considering the following detailed description of certain non-limiting embodiments of apparatus and methods according to the present disclosure. The reader also may comprehend certain of such additional details upon carrying out or using the apparatus and methods described herein.

DETAILED DESCRIPTION OF CERTAIN NON-LIMITING EMBODIMENTS

In the present description of non-limiting embodiments and in the claims, other than in the operating examples or where otherwise indicated, all numbers expressing quantities or characteristics of ingredients and products, processing conditions, and the like are to be understood as being modified in all instances by the term "about". Accordingly, unless indicated to the contrary, any numerical parameters set forth in the following description and the attached claims are approximations that may vary depending upon the desired properties one seeks to obtain in the apparatus and methods according to the present disclosure. At the very least, and not as an attempt to limit the application of the doctrine of equivalents to the scope of the claims, each numerical parameter should at least be construed in light of the number of reported significant digits and by applying ordinary rounding techniques.

Any patent, publication, or other disclosure material, in whole or in part, that is said to be incorporated by reference herein is incorporated herein only to the extent that the incorporated material does not conflict with existing definitions, statements, or other disclosure material set forth in this disclosure. As such, and to the extent necessary, the disclosure as set forth herein supersedes any conflicting material incorporated herein by reference. Any material, or portion thereof, that is said to be incorporated by reference herein, but which conflicts with existing definitions, statements, or other disclosure material set forth herein is only incorporated to the extent that no conflict arises between that incorporated material and the existing disclosure material.

Figure 1:
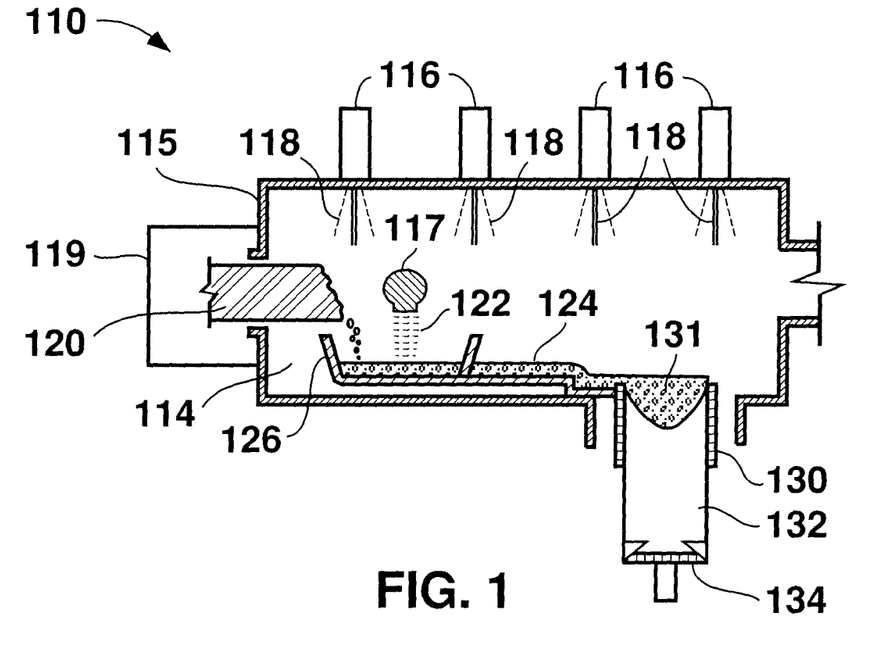
FIG. 1 is a schematic illustration in cross-section of an embodiment of a conventional thermo-ionic electron beam gun melting furnace.

The present disclosure, in part, is directed to an improved design for an electron beam furnace for melting metals and metallic alloys and/or for maintaining the materials in a molten state for use in preparing metallic castings or powders. A conventional thermo-ionic electron beam gun melting furnace is schematically illustrated in FIG. 1. Furnace 110 includes vacuum chamber 114 surrounded by chamber wall 115. Multiple thermo-ionic electron beam guns 116 are positioned outside and adjacent chamber 114 and direct discrete linear electron beams 118 into chamber 114. Feed material in the forms of metallic bar 120 and alloying powder 122 are introduced into chamber 114 by a conventional bar feeder 115 and a conventional particle or granule feeder 117, respectively. The linear electron beam 118 of one of the electron beam guns 116 impinges on and melts an end of bar 120, and the resulting molten alloy 124 falls into water-cooled copper refining hearth 126 (a "cold hearth") within chamber 114. The thermo-ionic electron beam guns 116 are of a conventional design and generate electrons by heating a suitable filament material. The guns 116 focus the generated electrons to a point, and the electrons are projected from the guns 116 in the form of a tightly focused, substantially linear beam. Thus, the electrons projected from the guns 116 essentially impinge on the target as a point source. The heating of the target by the point source of electrons is facilitated by rastering the linear electron beams 118 across at least a portion of the targets, similar to the manner of rastering electrons across the phosphor screen of a cathode ray television tube. Rastering the substantially linear electron beam 118 of a thermo-ionic electron beam gun 116 across the end region of bar 120, for example, melts the bar 120.

With further reference to FIG. 1, the molten alloy 124 deposited in hearth 126 is maintained in a molten state by rastering certain of the substantially linear electron beams 118 across the surface of the molten alloy 124 in a predetermined and programmed pattern. Powdered or granulated alloying materials 122 introduced into the molten alloy 124 by feeder 117 are incorporated into the molten material. Molten alloy 124 advances across the hearth 126 and drops from the hearth by gravity into a copper withdrawal mold 130. Withdrawal mold 130 includes a translatable base 134 so as to accommodate the length of the growing ingot 132. Molten alloy 124 initially collects in withdrawal mold 130 as molten pool 131, and progressively solidifies into ingot 132. Impingement of electrons onto molten pool 131 by means of rastering one or more of the substantially linear electron beams 118 across the pool's surface advantageously maintains regions of the pool 131, particularly at the pool edges, in a molten state.

In furnaces utilizing one or more substantially linear electron beams to heat material in the furnace chamber, such as a conventional thermo-ionic electron beam gun melting furnace, alloys including volatile elements, i.e., elements with relatively high vapor pressure at the furnace melting temperatures, tend to boil off from the molten pool and condense on the relatively cold walls of the furnace chamber. (Common alloying elements having relatively high vapor pressures at temperatures commonly achieved by electron beam melting include, for example, aluminum and chromium.) The substantially linear electron beam melting technique is particularly conducive to volatilization, which is a significant disadvantage of conventional electron beam furnaces when alloying, as opposed to refining or purifying, for at least two reasons. First, the overall and localized chemical composition of the alloy becomes difficult to control during melting due to unavoidable losses of highly volatile elements from the molten pool. Second, the condensate of the vaporized elements tends to build up on the furnace walls over time and can drop back into the melt, thereby contaminating the melt with inclusions and producing localized variations in melt chemistry.

Without intending to be bound by any particular theory, the inventors believe that the foregoing disadvantages of conventional electron beam melting furnaces result from the action of conventional substantially linear electron beams on the materials processed within electron beam furnaces. As suggested above in connection with the description of FIG. 1, conventional electron beam cold hearth melting technology utilizes substantially linear electron beams to both melt the raw materials introduced into the furnace and to maintain the temperature of the molten material as it flows along and over the cold hearth, and into the casting mold. Such furnaces typically include multiple electron beam sources, wherein each source produces a substantially linear electron beam that is essentially a point source. These "points" of intense electron concentration must be rastered rapidly over the areas to be heated so that the average temperature needed to melt the material and allow the molten material to adequately flow is reached throughout the target area. Because of the point source nature of the linear electron beams, however, the spot at which the electron beam impinges on the alloy is heated to an extremely high temperature. This phenomenon of localized intense heating can be observed as visible white radiation emitted from the particular spot at which the electron beam impinges on the solid or molten alloy within the furnace. It is believed that the intense superheating effect that occurs at these spots, along with the high vacuum maintained in the furnace chamber, readily evaporates the relatively volatile elements within the alloy, resulting in the excessive evaporation of the volatile elements and concomitant condensation on the chamber walls. As noted above, such condensation risks contamination of the bath as the condensed material drops back into the molten alloy, and this can result in, for example, marked compositional heterogeneities in the cast ingots.

An improved design for an electron beam melting furnace described herein utilizes one or more wire-discharge ion plasma electron emitters as at least a part of the electron source in such a furnace. As used herein, the term "wire-discharge ion plasma electron emitter" refers to an apparatus that produces a relatively wide, non-linear field of electrons by impinging positively charged ions onto a cathode and thereby releasing electrons from the cathode. The electron beam produced by a wire-discharge ion plasma electron emitter is not a linear beam, but instead is a three-dimensional field or "flood" of electrons that, when impinged on the target, covers a two-dimensional region that is very large relative to the small point covered by impinging a substantially linear electron beam onto the target. As such, the electron field produced by wire-discharge ion plasma electron emitters is referred to herein as a "wide-area" electron field, with reference to the relatively much smaller point of contact produced by conventional electron guns used in electron beam melting furnaces. Wire-discharge ion plasma electron emitters are known in the art (for use in unrelated applications) and are variously referred to as, for example, "wire ion plasma (WIP) electron" guns or emitters, "WIP electron" guns or emitters and, somewhat confusingly, as "linear electron beam emitters" (referring to the linear nature of the plasma-producing wire electrode(s) within certain embodiments of the devices).

Figure 2:
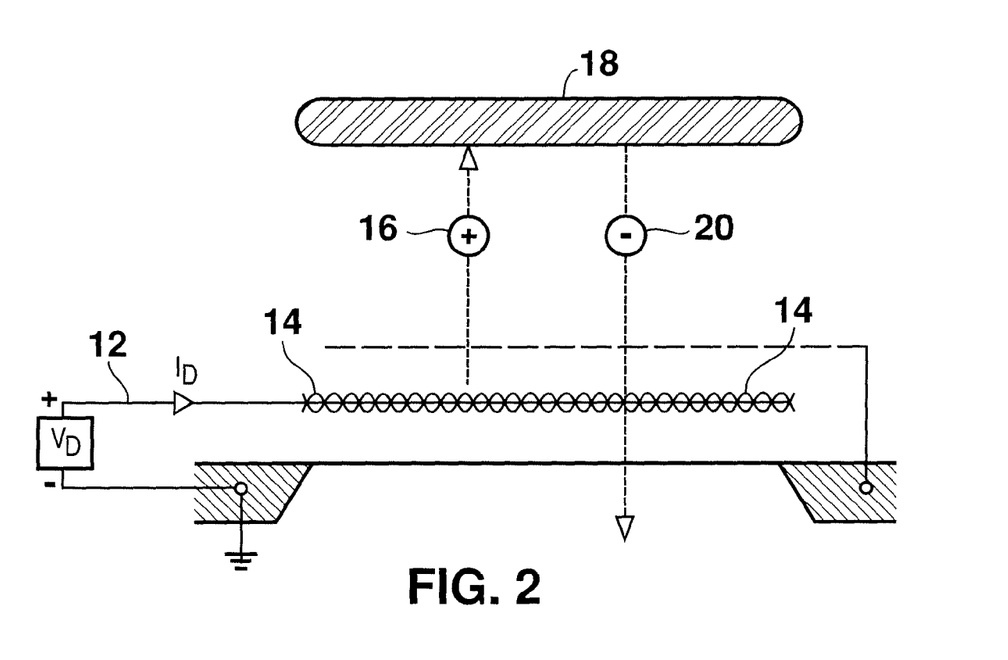
FIG. 2 is a simplified depiction of certain components of an embodiment of a wire-discharge ion plasma electron emitter.

Wire-discharge ion plasma electron emitters are available in a variety of designs, but all such emitters share certain fundamental design attributes. Each such emitter includes a plasma or ionization region including a positive ion source in the form of an elongate wire anode to produce plasma including cations, and a cathode that is spaced from and positioned to intercept positive ions generated by the wire. A large negative voltage is applied to the cathode, causing a fraction of the positive ions in the plasma generated by the wire positive ion source to be accelerated toward and to collide with the cathode surface such that secondary electrons are emitted from the cathode (the "primary" electrons being present within the plasma along with the positive ions). The secondary electrons produced from the cathode surface form a non-linear electron field that typically has the three-dimensional shape of the positive ion plasma impacting the cathode. The secondary electrons are then accelerated from the vicinity of the cathode back toward the anode, experiencing few collisions in the process of passing through the low-pressure gas within the emitter. By properly designing and arranging the various components of the wire-discharge ion plasma electron emitter, a wide field of energetic secondary electrons can be formed at the cathode and accelerated from the emitter and toward the target. FIG. 2 is a simplified depiction of components of a wire-discharge plasma ion electron emitter, wherein a current is applied to a thin wire anode 12 to generate plasma 14. Positive ions 16 within plasma 14 accelerate toward and collide with negatively-charged cathode 18, liberating wide-area secondary electron cloud 20, which is accelerated in the direction of anode 12 by action of the electric field between the electrodes and toward the target.

According to one non-limiting embodiment according to the present disclosure, an apparatus for melting an electrically conductive metallic material in the form of an electron beam melting furnace includes a vacuum chamber (melting chamber) and a hearth disposed in the vacuum chamber and adapted to hold a molten material. At least one wire-discharge ion plasma electron emitter is disposed in or adjacent to the vacuum chamber and is positioned to direct a non-linear, wide-area field of electrons generated by the emitter into the chamber. The wire-discharge ion plasma electron emitter produces a non-linear field of electrons having sufficient energy to heat the electrically conductive metallic material to its melting temperature. A mold or other casting or atomizing device is disposed in communication with the chamber and is positioned and adapted to receive material from the hearth. The furnace may be used to melt any material that may be melted using a conventional electron beam melting furnace, such as, for example, titanium, titanium alloys, tungsten, niobium, tantalum, platinum, palladium, zirconium, iridium, nickel, nickel base alloys, iron, iron base alloys, cobalt, and cobalt base alloys.

Embodiments of an electron beam melting furnace according to the present disclosure may include one or more material feeders adapted to introduce electrically conductive materials or other alloying additives into the vacuum chamber. Preferably, the feeders introduce the materials into the vacuum chamber in a position over or above at least a region of the hearth so that gravity will allow the materials, in solid or molten form, to fall downward and into the hearth. Feeder types may include, for example, bar feeders and wire feeders, and the feeder type selected will depend upon the particular design requirements for the furnace. In certain embodiments of the furnace according to the present disclosure, the material feeder and at least one of the one or more wire-discharge ion plasma electron emitters of the furnace are disposed so that the electron field emitted by the wire-discharge ion plasma electron emitter at least partially impinges on the material introduced into the chamber by the feeder. If the material that is introduced into the vacuum chamber by the feeder is electrically conductive, then the electron field, if of sufficient strength, will heat and melt the material.

The hearth incorporated in embodiments of a melting furnace according to the present disclosure may be selected from the various hearth types known in the art. For example, the furnace may be in the nature of an electron beam cold hearth melting furnace by incorporating a cold hearth or, more specifically, for example, a water-cooled copper cold hearth in the vacuum chamber. As is known to those of ordinary skill, a cold hearth includes cooling means causing molten material within the hearth to freeze to the hearth surface and form a protective layer thereon. As another example, the hearth may be an "autogenous" hearth, which is a hearth that is plated with or fabricated from the alloy that is being melted in the furnace, in which case the bottom surface of the hearth also may be water-cooled to prevent burn-through.

The particular hearth included in the vacuum chamber may include a molten material holding region, in which the molten material resides for a certain dwell time before passing to the casting or atomizing device fluidly connected to the vacuum chamber. In certain embodiments of a furnace according to the present disclosure, the hearth and at least one of the furnace's one or more wire-discharge ion plasma electron emitters are disposed so that the electron field emitted by the wire-discharge ion plasma electron emitter at least partially impinges on the molten material holding region. In this way, the electron field may be applied to maintain the material within the molten material holding region in a molten state, and the heating action of the electron field may also serve to degas and refine the molten material.

Certain non-limiting embodiments of a furnace according to the present disclosure include a mold for casting the molten material. The mold may be any suitable mold known in the art such as, for example, a static mold, a withdrawal mold, or a continuous casting mold. Alternatively, the furnace may include or be associated with an atomization apparatus for producing a powdered material from the molten material.

One particular non-limiting embodiment of an electron beam melting furnace according to the present disclosure includes a vacuum chamber and a hearth disposed in the vacuum chamber, wherein the hearth includes a molten material holding region. The furnace further includes one or more wire-discharge ion plasma electron emitters disposed in or adjacent the vacuum chamber. The hearth and the at least one wire-discharge ion plasma electron emitter are disposed so that an electron field produced by the emitter at least partially impinges on the molten material holding region. A withdrawal mold communicates with the vacuum chamber and is positioned to receive molten material from the hearth. A least one feeder is included in the furnace and is adapted to introduce material into the vacuum chamber in a position over at least a region of the hearth.

Any suitable wire-discharge ion plasma electron emitter may be used in connection with apparatus according to the present disclosure. Suitable embodiments of wire-discharge ion plasma electron emitters are disclosed in, for example, U.S. Pat. Nos. 4,025,818; 4,642,522; 4,694,222; 4,755,722; and 4,786,844, the entire disclosures of which are hereby incorporated herein by reference. Suitable emitters include those capable of producing a non-linear, wide-area electron field that may be directed into the vacuum chamber of the furnace and that will heat electrically conductive feed materials placed into the furnace chamber to the desired temperature.

In one embodiment of a wire-discharge ion plasma electron emitter, the emitter includes a plasma region and a cathode region. The plasma region includes at least one elongate wire anode adapted to produce a plasma including positive ions. The cathode region includes a cathode which is electrically connected to a high voltage power supply adapted to negatively charge the cathode. In the wire-discharge ion plasma electron emitter, the electrode used to produce the plasma may be one wire or multiple wires positioned along a length of the plasma region. At least a portion of the cathode impacted by the positive ions is composed of a material suitable for generating electrons. Certain non-limiting embodiments of the cathode disposed in the cathode region of the emitter also may include an insert, such as, for example, a molybdenum insert, having a high melting temperature and a low work function so as to facilitate generation of electrons. The cathode and the anode are positioned relative to one another so that the positive ions in the plasma generated by the wire anode accelerate toward and impinge on the cathode under influence of the electric field between the electrodes, liberating the wide-area field of secondary electrons from the cathode.

Certain non-limiting embodiments of the wire-discharge ion plasma electron emitter include at least one suitably electron transmissive window, such as a thin electron transmissive titanium or aluminum foil, that opens through a wall of the furnace vacuum chamber. Alternative materials from which the electron transmissive window may be constructed include, for example, BN, diamond, and certain other materials composed of low atomic number elements. As discussed herein, other embodiments of the wire-discharge ion plasma electron emitter do not include an electron transmissive window, in which case the plasma region of the emitter fluidly communicates with the vacuum chamber holding the molten material. In either case, the wide-area electron field derived enters the furnace chamber and may be impinged on the material within the chamber. If an electron transmissive window does separate the interior of the electron emitter from the vacuum chamber (as discussed further herein), then the electron field passes through the window as it is projected from the electron emitter into the vacuum chamber. In certain non-liming embodiments of a wire-discharge ion plasma electron emitter, the high voltage power supply electrically coupled to the cathode powers the cathode to a negative voltage greater than 20,000 volts. The negative voltage serves the functions of accelerating the positive ions in the plasma toward the cathode and then repelling the secondary electron field from the cathode and toward the anode.

An electron transmissive window is necessary if the pressure within the wire-discharge ion plasma electron emitter differs significantly from the pressure within the furnace chamber, in which case the foil window serves to isolate the two adjacent regions of differing pressure. An advantage of wire-discharge ion plasma electron emitters relative to non-gas containing electron emitters, such as thermo-ionic electron beam guns, is that wire-discharge ion plasma electron emitters must include gas within the plasma region to serve as the plasma source. Although wire-discharge ion plasma electron emitters can operate at very low gas pressures, such devices also can operate effectively at relatively high gas pressures. In contrast, conventional electron beam melting furnaces commonly operate at ultra low vacuum conditions, and in that case an electron transmissive window would be necessary to separate the gas atmosphere within the wire-discharge ion plasma electron emitter and the near vacuum environment within the furnace chamber. It appears, however, that volatile element evaporation within the furnace chamber may be reduced by increasing the gas pressure within the furnace chamber beyond the ultra-low levels of conventional linear (thermo-ionic emitter) electron beam melting furnaces. Those conventional pressures levels are typically within the range of $10^{-3}$ to 7.5µ ($10^{-3}$ to 1 Pa) and do not exceed 15µ (2 Pa). Increasing pressure within the furnace chamber beyond conventional levels, i.e., to pressures exceeding 40µ (5.3 Pa), or more preferably exceeding 300µ (40 Pa), increases the pressure at the surface of the molten material within the furnace and thereby reduces the driving force for undesirable vaporization. For example, data presented in H. Duval et al., "Theoretical and Experimental Approach of the Volatilization in Vacuum Metallurgy", suggests that there is a significant reduction in chromium vapor transport at 66.7 Pa (500 mTorr) argon relative to 4.27 Pa (35 mTorr) argon. Because wire-discharge plasma ion electron emitters already require a partial gas pressure environment (typically of helium) to be operational, the present inventors consider it possible that both the wire-discharge plasma ion electron emitter and the furnace chamber could be operated at substantially the same pressure, wherein the pressure is sufficiently high to allow the electron emitter to operate and also is higher than in conventional electron beam furnaces, thereby reducing undesirable volatilization within the furnace chamber. In such case, the electron transmissive window may be omitted such that the gas environment within the emitter and the furnace chamber is substantially the same. Alternatively, in another embodiment of a wire-discharge ion plasma electron emitter the electrons generated by the emitter pass through a gas-impermeable window that is transparent to electrons, wherein the pressure of ionizable gas within the emitter is suitable for electron emitter operation and the furnace chamber is operated at a pressure greater than conventional pressures in electron beam furnaces and is suitable for minimizing or reducing undesirable volatilization. It will be understood that the reduction in undesirable elemental vaporization would be optimized by both utilizing one or more wire-discharge ion plasma electron emitters, which do not create points of intense heating, along with furnace chamber pressures greater than is conventional in electron beam furnaces.

Further discussion of possible embodiments of an electron beam melting furnace and possible embodiments of a wire-discharge ion plasma electron emitter useful in connection with a furnace according to the present disclosure are provided below.

Figure 3:
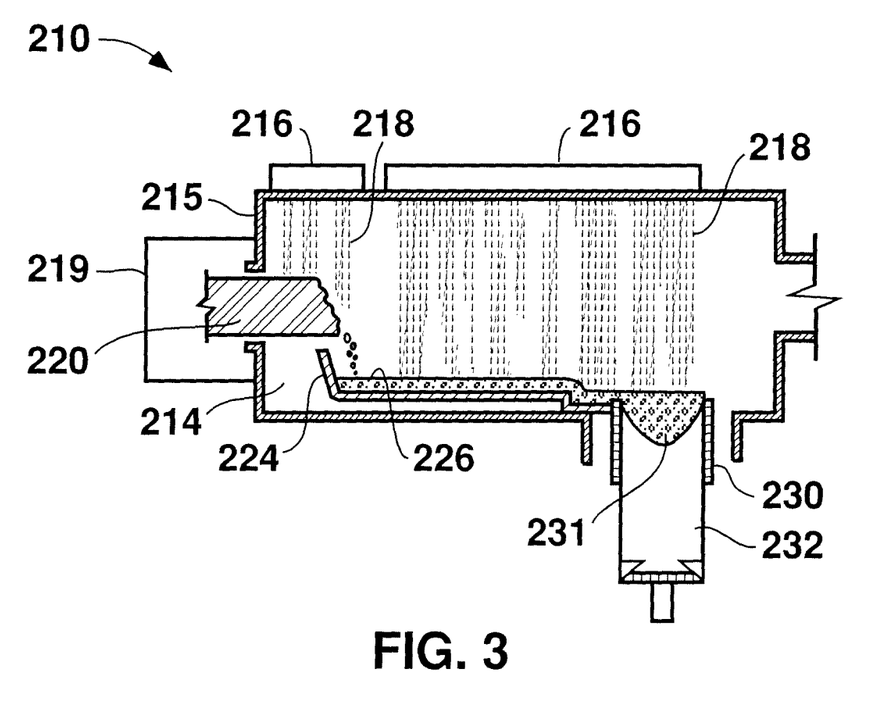
FIG. 3 is a schematic illustration in cross-section of one non-limiting embodiment of an electron beam cold hearth melting furnace including multiple wire-discharge ion plasma electron emitters according to the present disclosure.

FIG. 3 schematically illustrates one possible non-limiting embodiment of an improved electron beam melting furnace according to the present disclosure. Furnace 210 includes vacuum chamber 214 at least partially defined by chamber wall 215. Wire-discharge ion plasma electron emitters 216 are positioned outside and adjacent chamber 214. The wire-discharge ion plasma electron emitters 216 project wide-area electron fields 218 into the interior of the chamber 214. Similar to the conventional furnace 110 shown in FIG. 1, alloy bar 220 is introduced into chamber 214 by a bar feeder 215.

Molten alloy 226 is produced by impinging the wide-area electron field 218 of at least one wire-discharge ion plasma electron emitter 216 onto bar 220. The molten alloy 226 melted from bar 220 drops into water-cooled copper hearth 224, is resident in the hearth 224 for a certain dwell time, where it is heated, degassed, and refined by one or more of the wide-area electron fields 218 produced by emitters 216. The molten alloy 226 ultimately drops from hearth 224 into copper mold 230 and forms a molten pool 231. Molten pool 231 ultimately and progressively solidifies in mold 230 to form ingot 232. At least one of the wide-area electron fields 218 preferably heats the molten alloy within pool 231 in a manner advantageous to controlling the solidification rate of the forming ingot 232.

As discussed above, the wire-discharge ion plasma electron emitters 216 of furnace 210 are designed to generate a field or "flood" of energetic electrons covering a wide area relative to the spot coverage of the substantially linear beam produced by electron beam guns used in conventional electron beam furnaces. The electron field emitters 216 spread electrons over a wide area and impinge on the materials to be melted and/or maintained in the molten state within the furnace 210. Because the electron field it produces will cover a wide area within the furnace chamber, a wire-discharge ion plasma electron emitter will maintain a more even temperature within the electron beam melting furnace relative to a conventional electron beam furnace, and also dispenses with the need to raster a highly focused spot of electrons. Nevertheless, certain embodiments of the electron beam furnace according to the present disclosure may include components generating electric fields or other suitable components to steer the field of electrons generated by the one or more wire-discharge ion plasma electron emitters as desired. For example, in furnace 210 it may be desirable to raster the broad field produced by a wire-discharge ion plasma electron emitter 216 from side-to-side to provide additional heat to edges of the hearth 224. By flooding a relatively wide area with a field of energetic electrons, rather than rastering a point source of electrons across the area, the localized intense heating effect (e.g., power per unit area) associated with substantially linear electron beams that occurs when using conventional electron beam melting furnaces is significantly reduced. This eliminates or at least significantly reduces the extent to which relatively volatile alloying elements undesirably evaporate for the reason that points of relatively extremely high temperature are not produced. This, in turn, partially or wholly obviates the compositional control and contamination problems inherent in the conventional electron beam furnace design.

Figure 4:
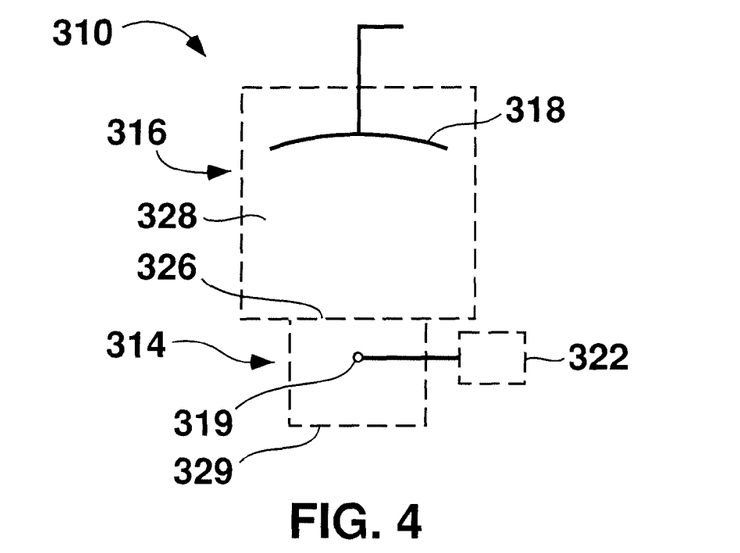
FIG. 4 is a schematic illustration of one non-limiting embodiment of a wire-discharge ion plasma electron emitter.

As noted above, various embodiments of wire-discharge ion plasma electron emitters generally include one or more elongate wire anodes producing positive ion plasma, wherein the plasma is impinged upon a cathode to generate a field of secondary electrons that may be accelerated to impinge on a target that is to be heated. A schematic representation of one known design of a wire-discharge ion plasma electron emitter, previously used in other, unrelated, applications, is shown in FIG. 4. This emitter 310 includes an ionization or plasma region 314 in which a positive ion plasma is produced, and a cathode region 316 that includes cathode 318. The plasma region 314 is filled with an ionizable gas at low pressure, and the gas is ionized in the plasma region to produce the cation-containing plasma. For example, the ionization region 314 may be filled with helium gas at, for example, approximately 20 mTorr. A small diameter elongate wire anode 319 passes through a length of the plasma region 314. A positive voltage is applied to wire anode 319 by power supply 322, and this initiates ionization of the helium gas into a plasma comprising helium cations and free electrons (the "primary" electrons). Once ionization of the helium gas is initiated, the plasma is sustained by applying a voltage to the thin wire anode 319. Positively charged helium ions within the plasma are extracted from the ionization chamber 314 through an extraction grid 326 maintained at a high negative electrical potential and accelerated through a high voltage gap into the cathode region 316, where the cations in the plasma impact high negative voltage cathode 318. Cathode 318 may be, for example, a coated or uncoated metal or alloy. Impingement of helium ions on cathode 318 releases secondary electrons from cathode 318. The high voltage gap 328 accelerates the secondary electrons in a direction opposite the direction of movement of the helium cations, through the extraction grid 326 and into the plasma region 314, and then through a thin metallic foil window 329 made of material relatively transparent to electrons. As noted above, depending on the relative gas pressures within the electron emitter and the furnace chamber, it may be possible to omit the foil window 329, in which case the electrons produced by the emitter would enter the furnace chamber directly.

The wire electrode 319 and the cathode 318 may be designed and arranged to better promote movement of the positively charged helium ions to the cathode 318. Also, the cathode 318 and the extraction grid 326 may be designed and arranged to maximize secondary electron transmission through the grid 326 and with a beam profile suitable for penetration through foil window 329, if present. The wide-area field of energetic electrons exiting the emitter 310 may be directed to impinge on a target positioned opposite foil window 329 and within the vacuum chamber of a melting furnace. Also, the window 329 may be sized to be as thin as possible in order to maximize electron transmission from emitter 310. An aluminum-type or titanium-type foil having a thickness allowing sufficient electron transmission, while also maintaining a soft vacuum environment within the emitter 310, may be used as foil window 329, if necessary. Other suitably strong and acceptably electron transparent materials that may be used as a window in the apparatus, if present, will be known to those having ordinary skill. As discussed generally herein, window 329 may be omitted if the pressure differences between the interior of the emitter 310 and the vacuum chamber containing the target are not significant.

Figure 5:
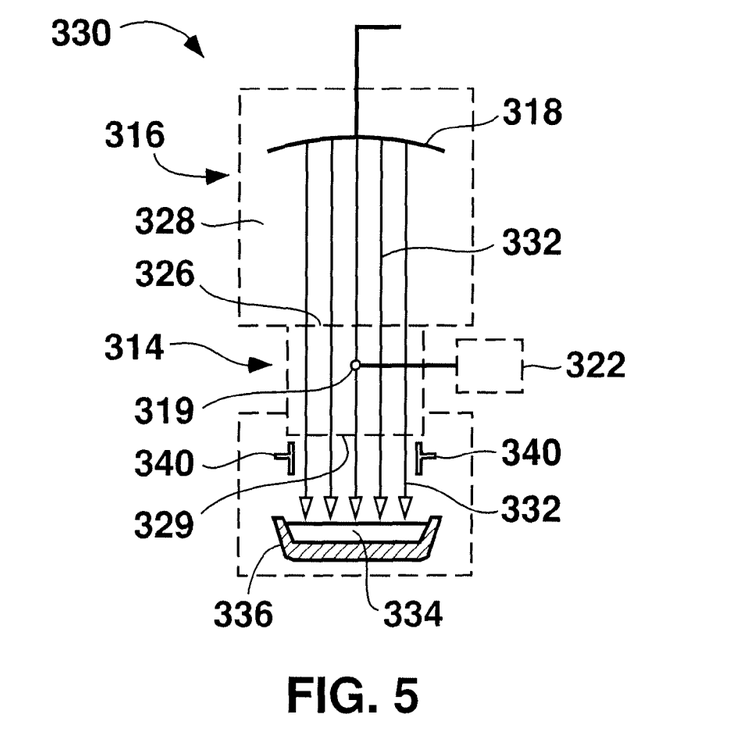
FIG. 5 is a schematic illustration of one non-limiting embodiment according to the present disclosure of an electron beam melting furnace including a wire-discharge ion plasma electron emitter as an electron source.

According to the present disclosure, one or more wire-discharge ion plasma electron emitters, such, for example, emitter 310, may be provided to supply the energetic electrons into the vacuum chamber of an electron beam melting furnace, as a substitute for electron beam guns producing a substantially linear electron beam. As shown in FIG. 5, one non-limiting embodiment of an electron beam melting furnace according to the present disclosure includes one or more wire-discharge ion plasma electron emitters 310 positioned adjacent vacuum chamber 330. Wide-area electron field 332 exits emitter 310 through film window 329 and floods at least a region of the surface of the molten alloy 334 in hearth 336, thereby heating the alloy to maintain it in a molten state. Because the electrons impinging on the alloy in hearth 336 are spread across a relatively wide area, the energy focused on the molten material in any particular localized region is not great enough to result in a problematic level of volatilization of elements from the alloy, thereby reducing or obviating the alloy contamination and heterogeneity problems inherent in the use of conventional electron beam melting furnaces. As noted above, film window 329 may be omitted if the operating pressure differential between the emitter 310 and the vacuum chamber 330 is not significant. Also, as noted above, the vacuum chamber 330 preferably is operated at a pressure higher than is conventional in order to further reduce or eliminate undesirable elemental vaporization, and in such case the need for a film window partitioning the electron emitter from the furnace chamber will, again, depend on the particular pressure differential inherent in the design. Optionally, components 340 for magnetically steering the wide-area electron field are provided so as to allow further improved control of the melting process within the vacuum chamber 330.

Although FIG. 5 provides a simplified view of one embodiment of a wire-discharge ion plasma electron melting furnace according to the present disclosure including a single electron emitter, it will be apparent to those of ordinary skill that actual or alternate embodiments of such an apparatus may have multiple wire-discharge ion plasma electron emitters. It also will be apparent that one or more wire-discharge ion plasma electron emitters may be incorporated in such an apparatus to: (1) melt raw materials introduced into the furnace, in the form of, for example, an alloy bar or wire; (2) maintain molten alloy resident in the furnace hearth at a temperature above the alloy melting temperature (and possibly degas and/or refine the molten alloy); and (3) maintain desired regions of the molten pool on the surface of the incrementally advancing cast ingot in a molten state, thereby influencing ingot solidification rate in a desired manner. Also, in certain embodiments, one or more wire-discharge ion plasma electron emitters may be used along with one or more electron beam guns producing conventional substantially linear electron beams.

Figure 6:
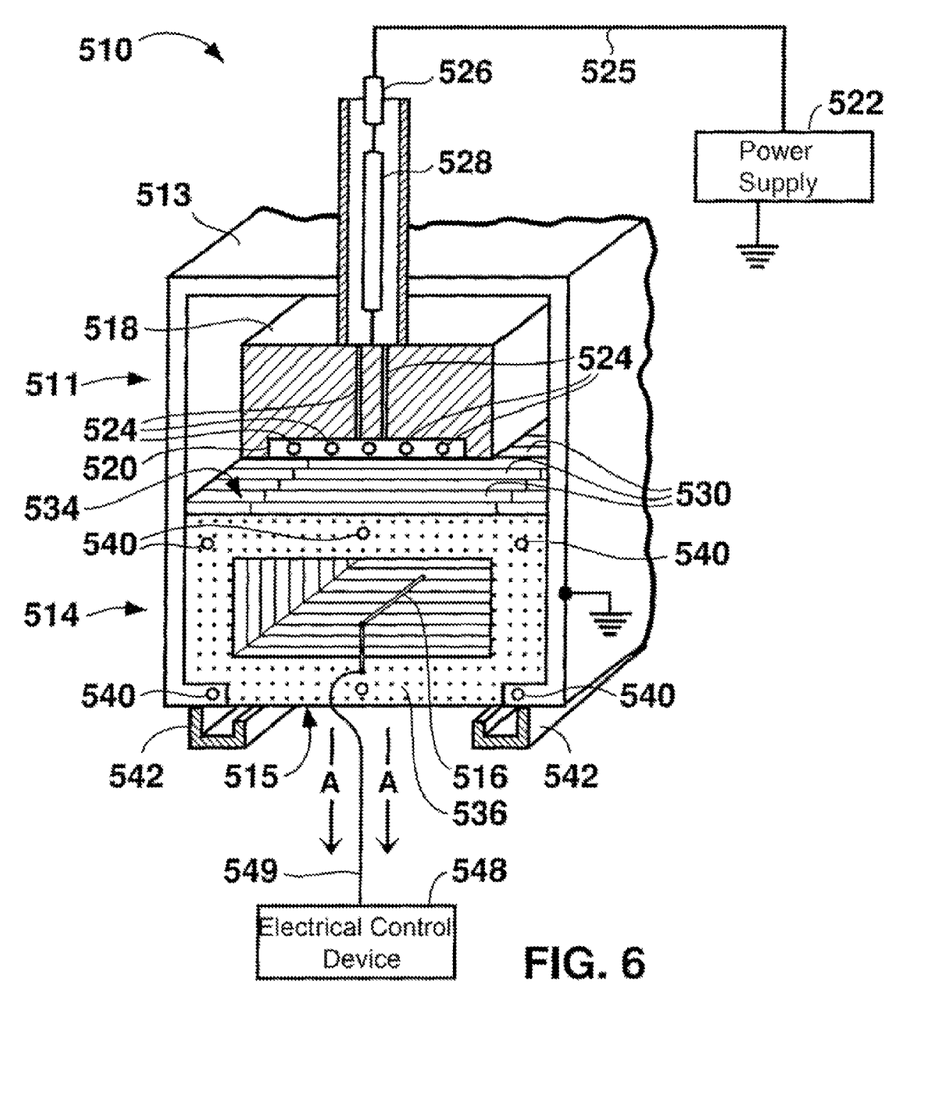
FIG. 6 is a perspective view, partly in section, of one non-limiting embodiment of a wire-discharge ion plasma electron emitter that may be adapted for use in an electron beam melting furnace according to the present disclosure.
Figure 7:
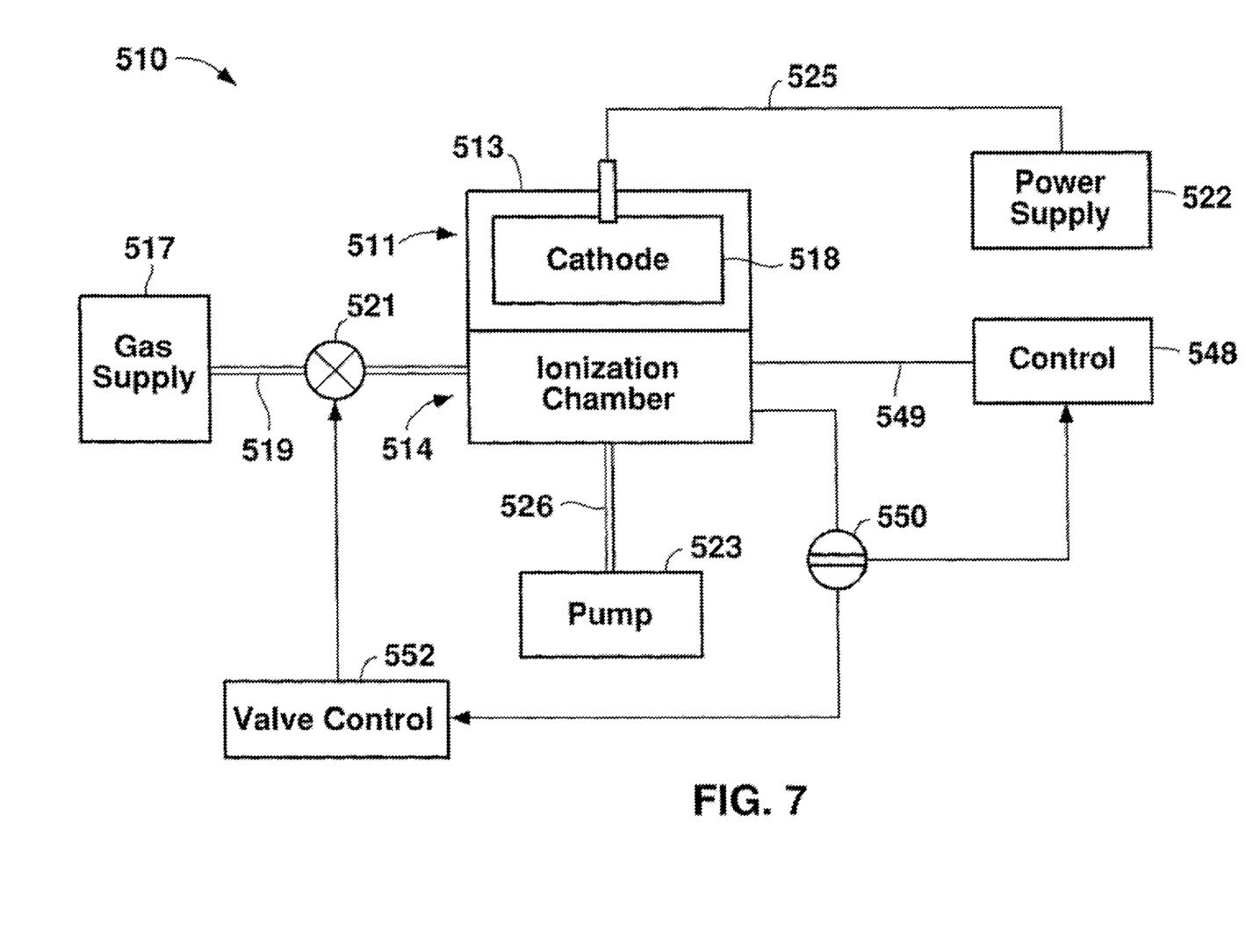
FIG. 7 is a diagram illustrating operation of the wire-discharge ion plasma electron emitter illustrated in FIG. 6.

FIGS. 6 and 7 provide additional details related to one possible non-limiting embodiment of a wire-discharge ion plasma electron emitter that may be adapted for use as the source of energetic electrons in an embodiment of an electron beam melting furnace according to the present disclosure. FIG. 6 is a perspective view, partly in section, of the wire-discharge ion plasma electron emitter embodiment. FIG. 7 is a schematic diagram illustrating, in a simplified way, the operation of emitter 510. Emitter 510 includes electrically grounded enclosure 513, which includes cathode region 511, ionization or plasma region 514, and electron transmissive foil window 515. Elongate wire electrode 516 extends through a length of ionization region 514. Foil window 515 is electrically coupled to chamber 513 and thereby forms an anode that operates to accelerate electrons within chamber 513 therethrough to exit chamber 513 in the general direction of arrows "A". Chamber 513 is filled with helium gas at low pressure, such as 1-10 mtorr, and is supplied with the gas by gas supply 517. Gas supply 517 is connected to enclosure 513 by conduit 519, which passes through valve 521. A soft vacuum environment is maintained in chamber 513 by pump 523, which is connected to chamber 513 by conduit 526.

Cathode region 511 includes cathode 518, which in turn includes insert 520 mounted on a lower surface thereof. The insert 520 may be composed of, for example, molybdenum, but may be composed of any material with a suitably high secondary electron emission coefficient. Cathode 518 is suitably uniformly spaced from the walls of enclosure 513 to prevent Paschen breakdown. Cathode 518 is coupled to high voltage power supply 522 by cable 525 which passes through insulator 526 and into resistor 528. Power supply 522 supplies high negative potential, for example, 200-300 KV, to cathode 518. Cathode 518 and insert 520 may be suitably cooled, such as by, for example, circulating oil or another suitable cooling fluid through conduits 524.

Ionization region 514 includes a plurality of thin metallic ribs which are coupled both electrically and mechanically. Each rib 530 includes a central cut-out region to allow wire electrode 516 to pass through the ionization chamber 514. The sides of ribs 530 facing cathode 518 form an extraction grid 534. The opposed side of all or a portion of the ribs 530 provide a support grid 536 for electron transmissive foil window 515. Cooling channels 540 may be provided to circulate a cooling fluid through and in the vicinity of ribs 530 to allow for heat removal from ionization region 514. Electron transmissive foil window 515, which may be composed of, for example, aluminum or titanium foil, is supported on grid 534 and is sealed to enclosure 513 by an O-ring or other structures sufficient to maintain the high vacuum helium gas environment within enclosure 513. In certain embodiments of emitter 510, a gas manifold 542 is provided to cool foil window 515, such as with pressurized nitrogen. As discussed generally herein, window 515 may be omitted if the pressure differences between the interior of the chamber 513 of emitter 510 and the chamber containing the target of the electron field are not significant.

An electrical control device 548 is connected to wire electrode 516 through connector 549. On activation of control device 548, wire electrode 516 is energized to a high positive potential, and helium within ionization region 514 is ionized to produce a plasma including helium cations. Once the plasma is initiated in ionization region 514, cathode 518 is energized by power supply 522. Helium cations in the ionization region 514 are electrically attracted to cathode 518 by the electric field that extends from the cathode 518 into the plasma region 514. The helium cations travel along the field lines, through the extraction grid 534, and into the cathode region 511. In the cathode region 511, the helium cations accelerate across the full potential of the electric field generated by the energized cathode 518 and forcefully impinge on the cathode 518 as a collimated beam of cations. The impacting cations free secondary electrons from the insert 520. The secondary electron field produced by the insert 520 is accelerated in a direction opposite the direction of travel of the helium cations, toward the wire electrode 516, and through foil window 515, if present.

Means may be provided to monitor the actual gas pressure within the chamber 513 as changes in pressure may affect the density of the helium ion plasma and, in turn, the density of the secondary electron field generated at the cathode 518. An initial pressure may be set within enclosure 513 by appropriately adjusting valve 521. Once the cation-containing plasma is initiated in plasma region 514, a voltage monitor 550 may be provided to indirectly monitor the instantaneous quiescent pressure within the chamber 513. A rise in voltage is indicative of a lower chamber pressure. The output signal of the voltage monitor 550 is used to control valve 521, through valve controller 552. The current supplied to wire electrode 516 by control device 548 also is controlled by the signal of voltage monitor 550. Utilizing the signal generated by voltage monitor 550 to control gas supply valve 521 and control device 548 allows for a stable electron field output from emitter 510.

The current generated by emitter 510 may be determined by the density of the cations impacting the cathode 518. The density of the cations impacting the cathode 518 may be controlled by adjusting the voltage on wire electrode 516 through control device 548. The energy of the electrons emitted from the cathode 518 may be controlled by adjusting the voltage on the cathode 518 through power supply 522. Both current and energy of the emitted electrons can be independently controlled, and the relationships between these parameters and the applied voltages are linear, rendering control of the emitter 510 both efficient and effective. In contrast, conventional thermo-ionic electron beam guns cannot be controlled in a corresponding linear manner when adjusting beam parameters.

Figure 8:
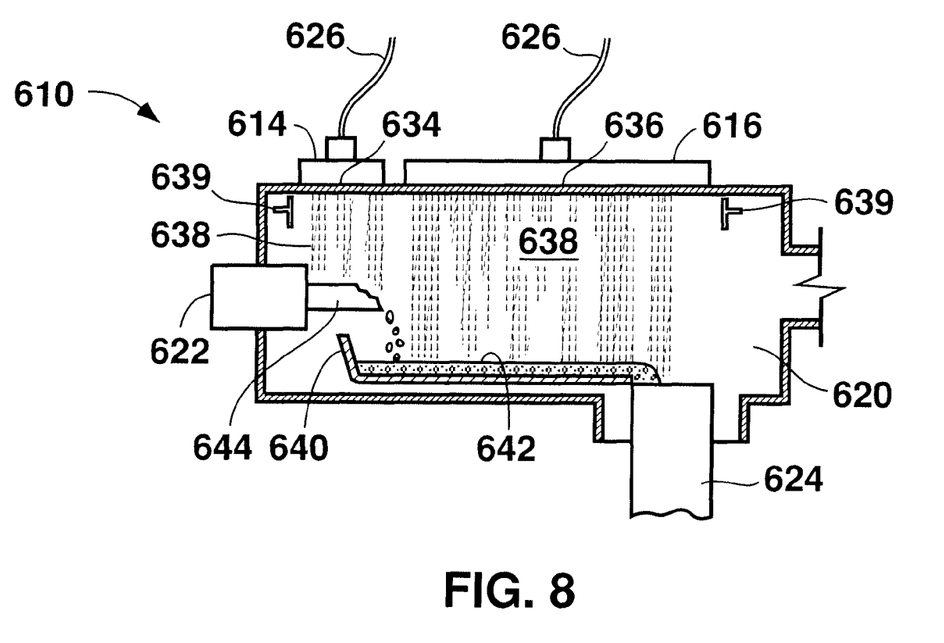
FIG. 8 is a schematic illustration in cross-section of one embodiment of an electron beam cold hearth melting furnace according to the present disclosure.

FIG. 8 is a schematic illustration of one embodiment of an electron beam melting furnace according to the present disclosure, wherein the furnace 610 incorporates two wire-discharge ion plasma electron emitters 614, 616 having a design as generally shown in FIGS. 6 and 7 and as discussed above in connection with those figures. Furnace 610 includes vacuum chamber 620, material feeder 622, and casting or atomizing device 624. Current required for operation of emitters 614 and 616, as discussed above, is fed to the emitters by power lines 626, and the interface between emitters 614, 616 and the vacuum chamber 620 includes electron transmissive foil windows 634, 636, which allow the electron fields 638 generated by the emitters 614, 616 to enter the vacuum chamber 620. The foil windows 634, 636 may be omitted if the operating pressures within the emitters 614, 616 and the vacuum chamber are identical or do not significantly differ. Means 639 for magnetically steering electron fields 638 may be included within vacuum chamber 620 to provide additional process control. A hearth 640, which may be, for example, a cold hearth, is disposed in vacuum chamber 620. In operation, wire-discharge ion plasma electron emitters 614, 616 are energized and generate electron fields 618. An electrically conductive feed material 644 is introduced into the vacuum chamber 620 by feeder 622, is melted by electron field 638 emitted from emitter 614, and drops to hearth 640. Wide-area electron field 638 emitted by emitter 616 heats, degasses, and refines the molten material 642 while resident in hearth 640. Molten material 642 advances along the hearth 640 and drops into casting or atomizing device 624 and is processed to a desired form.

Although the foregoing description has necessarily presented only a limited number of embodiments, those of ordinary skill in the relevant art will appreciate that various changes in the apparatus and methods and other details of the examples that have been described and illustrated herein may be made by those skilled in the art, and all such modifications will remain within the principle and scope of the present disclosure as expressed herein and in the appended claims. For example, although the present disclosure has necessarily only presented a limited number of embodiments of electron beam melting furnaces according to the present disclosure, and also has necessarily only discussed a limited number of wire-discharge ion plasma electron emitter designs, it will be understood that the present disclosure and associated claims are not so limited. Those having ordinary skill will readily identify additional wire-discharge ion plasma electron emitter designs and may design and build additional furnace designs along the lines and within the spirit of the necessarily limited number of embodiments discussed herein. It is understood, therefore, that the present invention is not limited to the particular embodiments disclosed or incorporated herein, but is intended to cover modifications that are within the principle and scope of the invention, as defined by the claims. It will also be appreciated by those skilled in the art that changes could be made to the embodiments above without departing from the broad inventive concept thereof.

We claim:

1. A method of processing a material, the method comprising:
    introducing a material comprising at least one of a metal and a metallic alloy into a furnace chamber maintained at a low pressure relative to atmospheric pressure, wherein the material comprises at least one electrically conductive material selected from the group consisting of titanium, titanium alloys, tungsten, niobium, tantalum, platinum, palladium, zirconium, iridium, nickel, nickel base alloys, iron, iron base alloys, cobalt, and cobalt base alloys;
    subjecting the material to a wide-area electron field within the furnace chamber to heat the material to a temperature above a melting temperature of the material, wherein the wide-area electron field is generated by a wire-discharge ion plasma electron emitter;
    optionally adding at least one alloying additive to the material; and
    forming a casting or a powder from the material subsequent to or simultaneous with subjecting the material to the wide-area electron field.

2. The method of claim 1, wherein a pressure within the wire-discharge ion plasma electron emitter is substantially the same as or less than a pressure within the furnace chamber.

3. The method of claim 1, wherein a pressure within the furnace chamber is maintained at greater than 40 μm Hg.

4. The method of claim 3, wherein maintaining the pressure within the furnace chamber at greater than 40 μm Hg decreases or eliminates undesirable evaporation of volatile elements from the material during heating of the material in the furnace chamber.

5. The method of claim 1, wherein a pressure within the furnace chamber is maintained at greater than 300 μm Hg.

6. The method of claim 5, wherein maintaining the pressure within the furnace chamber at greater than 300 μm Hg decreases or eliminates undesirable evaporation of volatile elements from the material during heating of the material in the furnace chamber.

7. A method of processing a material, the method comprising:
    introducing a material comprising at least one of a metal and a metallic alloy into a furnace chamber maintained at a low pressure relative to atmospheric pressure;
    subjecting the material to a wide-area electron field within the furnace chamber to heat the material to a temperature above a melting temperature of the material, wherein the wide-area electron field is generated by a wire-discharge ion plasma electron emitter; and
    wherein a pressure within the wire-discharge ion plasma electron emitter is substantially the same as or less than a pressure within the furnace chamber.

8. The method of claim 7, wherein the material comprises at least one of titanium, titanium alloys, tungsten, niobium, tantalum, platinum, palladium, zirconium, iridium, nickel, nickel base alloys, iron, iron base alloys, cobalt, and cobalt base alloys.

9. The method of claim 7, further comprising: forming a casting or a powder from the material subsequent to or simultaneous with subjecting the material to the wide-area electron field.

10. The method of claim 7, wherein a pressure within the furnace chamber is maintained at greater than 40 μm Hg, thereby decreasing or eliminating undesirable evaporation of volatile elements from the material during heating of the material in the furnace chamber.

11. The method of claim 7, wherein a pressure within the furnace chamber is maintained at greater than 300 μm Hg, thereby decreasing or eliminating undesirable evaporation of volatile elements from the material during heating of the material in the furnace chamber.

12. A method for decreasing or eliminating undesirable evaporation of volatile elements from a molten material to be processed during heating of the material in a vacuum chamber of an electron beam melting furnace to produce a processed material for casting or atomization to a powder, the method comprising:

introducing the material to be processed into the vacuum chamber of the electron beam melting furnace, wherein the material to be processed comprises at least one of a metal and a metallic alloy;

subjecting the material to be processed to an electron field to heat the material to be processed to a temperature above a melting temperature of the processed material; and     maintaining pressure within the vacuum chamber at greater than 300 μm Hg during the heating of the material to be processed above the melting temperature of the processed material.

13. The method of claim 12, wherein the processed material is selected from titanium, titanium alloys, tungsten, niobium, tantalum, platinum, palladium, zirconium, iridium, nickel, nickel base alloys, iron, iron base alloys, cobalt, and cobalt base alloys.

14. A method of processing a material, the method comprising:

introducing a material comprising at least one of a metal and a metallic alloy into a furnace chamber maintained at a low pressure relative to atmospheric pressure;

subjecting the material to a wide-area electron field within the furnace chamber to heat the material to a temperature above a melting temperature of the material, wherein the wide-area electron field is generated by a wire-discharge ion plasma electron emitter; and     wherein a pressure within the furnace chamber is maintained at greater than 40 μm Hg.

15. The method of claim 14, wherein maintaining the pressure within the furnace chamber at greater than 40 μm Hg decreases or eliminates undesirable evaporation of volatile elements from the material during heating of the material in the furnace chamber.

16. The method of claim 14, wherein the pressure within the furnace chamber is maintained at greater than 300 μm Hg.

17. The method of claim 16, wherein maintaining the pressure within the furnace chamber at greater than 300 μm Hg decreases or eliminates undesirable evaporation of volatile elements from the material during heating of the material in the furnace chamber.

18. The method of claim 16, wherein the material comprises at least one electrically conductive material selected from the group consisting of titanium, titanium alloys, tungsten, niobium, tantalum, platinum, palladium, zirconium, iridium, nickel, nickel base alloys, iron, iron base alloys, cobalt, and cobalt base alloys.

* * * * *